United States Patent
Yokota et al.

(10) Patent No.: US 11,116,073 B2
(45) Date of Patent: Sep. 7, 2021

(54) CONNECTOR-CABLE MODULE

(71) Applicant: SUMITOMO ELECTRIC INDUSTRIES, LTD., Osaka (JP)

(72) Inventors: Naoshige Yokota, Tochigi (JP); Masaki Suzuki, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/776,997

(22) Filed: Jan. 30, 2020

(65) Prior Publication Data
US 2020/0260571 A1   Aug. 13, 2020

(30) Foreign Application Priority Data

Feb. 8, 2019   (JP) .............................. JP2019-021321

(51) Int. Cl.
| | |
|---|---|
| *H05K 1/02* | (2006.01) |
| *H01R 13/6461* | (2011.01) |
| *H01R 24/60* | (2011.01) |
| *H05K 1/11* | (2006.01) |
| *H01R 12/53* | (2011.01) |

(52) U.S. Cl.
CPC .......... *H05K 1/0228* (2013.01); *H01R 12/53* (2013.01); *H01R 13/6461* (2013.01); *H01R 24/60* (2013.01); *H05K 1/117* (2013.01)

(58) Field of Classification Search
CPC ........................... H01R 12/53; H01R 13/6461; H01R 13/6467; H01R 24/60; H05K 1/0228; H05K 1/117
See application file for complete search history.

(56) References Cited

U.S. PATENT DOCUMENTS

| | | | | |
|---|---|---|---|---|
| 8,506,332 B2* | 8/2013 | Sommers | ............. | H01R 12/707 439/607.34 |
| 8,864,501 B2* | 10/2014 | Lin | ..................... | H01R 13/6477 439/79 |
| 8,911,262 B1* | 12/2014 | Leiba | ..................... | H01R 24/60 439/660 |
| 9,105,376 B2* | 8/2015 | Gundel | .................... | H01B 7/02 |
| 9,124,051 B2* | 9/2015 | Tanaka | ............... | H01R 13/6471 |
| 2018/0366852 A1* | 12/2018 | Yang | .................... | H01R 12/721 |
| 2020/0036117 A1* | 1/2020 | Little | ..................... | H01R 12/53 |

FOREIGN PATENT DOCUMENTS

JP   2017-069152   4/2017

* cited by examiner

*Primary Examiner* — Renee S Luebke
*Assistant Examiner* — Paul D Baillargeon
(74) *Attorney, Agent, or Firm* — Ipusa, PLLC

(57) ABSTRACT

A connector-cable module includes a multicore cable including first, second, and third signal lines; and a connector connected to one end of the multicore cable and including a board and first, second, and third pads connected to the first, second, and third signal lines and provided on the board. A first signal and a second signal transmitted through the first and second signal lines form a differential signal. The connector is configured such that when a line passes through a first gravity center of the first pad and a second gravity center of the second pad, a foot of a perpendicular drawn from a third gravity center of the third pad to the line is located between the first gravity center and the second gravity center.

4 Claims, 11 Drawing Sheets

CONNECTOR-CABLE MODULE

CROSS-REFERENCE TO RELATED APPLICATION

The present application is based upon and claims priority to Japanese Patent Application No. 2019-021321, filed on Feb. 8, 2019, the entire contents of which are incorporated herein by reference.

BACKGROUND OF THE INVENTION

1. Field of the Invention

An aspect of this disclosure relates to a connector-cable module.

2. Description of the Related Art

Japanese Laid-Open Patent Publication No. 2017-069152 discloses a multicore cable with connectors (which may be hereafter referred to as a "connector-cable module") used for transmission between electronic devices. The connector-cable module can be connected to an electronic device regardless of the vertical orientation of the connector.

Although the connector-cable module disclosed in Japanese Laid-Open Patent Publication No. 2017-069152 can achieve an intended purpose, non-negligible noise may be generated in the connector-cable module.

SUMMARY OF THE INVENTION

In an aspect of this disclosure, there is provided a connector-cable module that includes a multicore cable and a connector connected to one end of the multicore cable. The multicore cable includes a first signal line that transmits a first signal, a second signal line that transmits a second signal, and a third signal line that transmits a third signal that is independent of the first signal and the second signal. The first signal and the second signal form a differential signal. The connector includes a board, a first pad provided on the board and connected to the first signal line, a second pad provided on the board and connected to the second signal line, and a third pad provided on the board and connected to the third signal line. The connector is configured such that when a line passes through a first gravity center of the first pad and a second gravity center of the second pad, a foot of a perpendicular drawn from a third gravity center of the third pad to the line is located between the first gravity center and the second gravity center.

DESCRIPTION OF THE PREFERRED EMBODIMENTS

Figure 1:
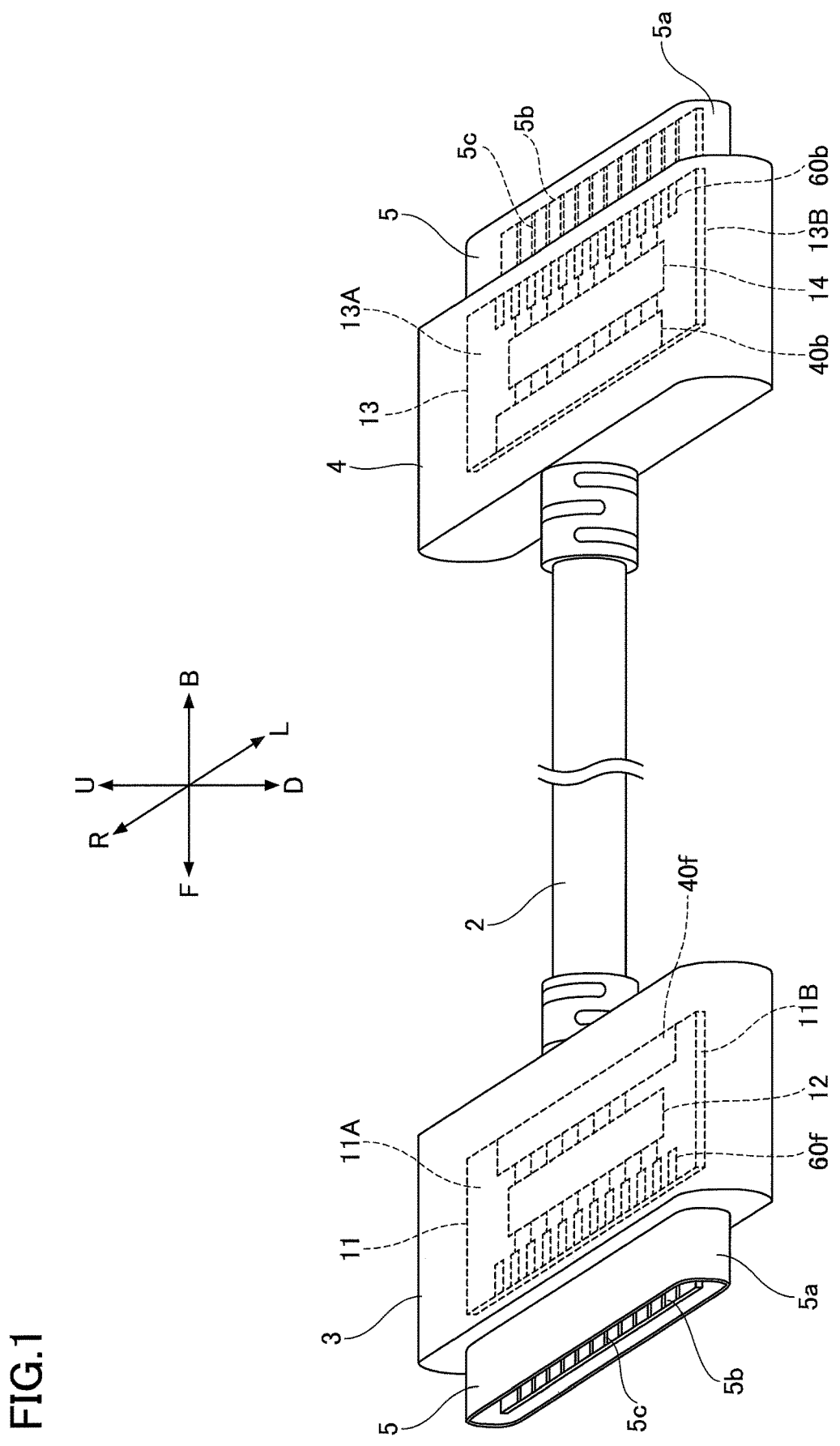
FIG. 1 is a perspective view of a connector-cable module according to an embodiment.

An embodiment of the present invention is described below.

Descriptions of Embodiment

<1> According to an aspect of this disclosure, a connector-cable module includes a multicore cable and a connector connected to one end of the multicore cable. The multicore cable includes a first signal line that transmits a first signal, a second signal line that transmits a second signal, and a third signal line that transmits a third signal that is independent of the first signal and the second signal. The first signal and the second signal form a differential signal. The connector includes a board, a first pad provided on the board and connected to the first signal line, a second pad provided on the board and connected to the second signal line, and a third pad provided on the board and connected to the third signal line. The connector is configured such that when a line passes through a first gravity center of the first pad and a second gravity center of the second pad, a foot of a perpendicular drawn from a third gravity center of the third pad to the line is located between the first gravity center and the second gravity center.

The foot of the perpendicular drawn from the third gravity center to the line passing through the first gravity center and the second gravity center is located between the first gravity center and the second gravity center. With this configuration, crosstalk between the first signal and the third signal and crosstalk between the second signal and the third signal cancel each other, and noise resulting from the crosstalk is reduced.

<2> The first signal line and the second signal line are stranded and are therefore suitable for transmission of a differential signal.

<3> The first pad and the third pad are at such a distance from each other that crosstalk occurs between the first signal and the third signal, and the second pad and the third pad are at such a distance from each other that crosstalk occurs between the second signal and the third signal. The configuration of the present embodiment is particularly effective when such crosstalk occurs.

<4> The first pad and the second pad are provided on a first surface of the board, and the third pad is provided on a second surface of the board that is opposite the first surface of the board. This configuration makes it possible to arrange the first pad and the second pad next to each other, and makes it possible to reliably transmit a differential signal.

<5> According to another aspect of this disclosure, a connector-cable module includes a multicore cable and a connector connected to one end of the multicore cable. The multicore cable includes a first signal line that transmits a first signal, a second signal line that transmits a second signal, and a third signal line that transmits a third signal that is independent of the first signal and the second signal. The first signal line and the second signal line are stranded, and the first signal and the second signal form a differential signal. The connector includes a board, a first pad provided on a first surface of the board and connected to the first signal line, a second pad provided on the first surface of the board and connected to the second signal line, and a third pad provided on a second surface of the board and connected to the third signal line. The second surface is opposite the first surface of the board. The connector is configured such that when a line passes through a first gravity center of the first pad and a second gravity center of the second pad, a foot of a perpendicular drawn from a third gravity center of the third pad to the line is located between the first gravity center and the second gravity center.

Details of Embodiment

An embodiment of the present invention is described below with reference to the accompanying drawings. However, the present invention is not limited to this embodiment. In the specification and the drawings, the same reference number may be assigned to components having substantially the same function and/or configuration, and repeated descriptions of those components may be omitted.

Configuration of Connector-Cable Module

First, a configuration of a multicore cable with connectors (which is hereafter referred to as a "connector-cable module") according to the embodiment is described. FIG. 1 is a perspective view of a connector-cable module 1 according to the embodiment.

The connector-cable module 1 of the present embodiment may be used, for example, to connect electronic devices (not shown) to each other. In FIG. 1, U, D, F, B, R, and L indicate directions in the connector-cable module 1. That is, U indicates "upward" (or upper), D indicates "downward" (or lower), F indicates "front", B indicates "back" (or behind), R indicates "right", and L indicates "left".

As illustrated in FIG. 1, the connector-cable module 1 includes a multicore cable 2, a first connector 3, and a second connector 4. The first connector 3 is attached to the front end of the multicore cable 2. The second connector 4 is attached to the back end of the multicore cable 2.

The connector-cable module 1 also includes connector plugs 5 that are to be connected to receptacles (not shown) of electronic devices. One of the connector plugs 5 is disposed at the front end of the first connector 3, and another one of the connector plugs 5 is disposed at the back end of the second connector 4. Each connector plug 5 includes a metal shell 5a that serves as a housing and has a substantially elliptical-cylinder shape. A pin holding plate 5b is housed in the metal shell 5a. The pin holding plate 5b holds contact pins 5c to be connected to the receptacle (not shown) of an electronic device. The contact pins 5c are arranged on the pin holding plate 5b such that the contact pins 5c are connectable to the receptacle of an electronic device even if the right-left orientation or the upward-downward orientation of the first connector 3 or the second connector 4 is reversed.

The first connector 3 includes an internal first board 11 to which the multicore cable 2 is connected. The first board 11 has a first surface 11A and a second surface 11B. In this example, the first surface 11A is the upper surface of the first board 11, and the second surface 11B is the lower surface of the first board 11. The first board 11 includes a first circuit 12, pads 40f connected to the back end of the first circuit 12, and connector pins 60f connected to the front end of the first circuit 12. The pads 40f and the connector pins 60f are provided on the first surface 11A and the second surface 11B of the first board 11. For example, the thickness of the first board 11 is between 0.5 mm and 1.0 mm.

The second connector 4 includes an internal second board 13 to which the multicore cable 2 is connected. The second board 13 has a first surface 13A and a second surface 13B. In this example, the first surface 13A is the upper surface of the second board 13, and the second surface 13B is the lower surface of the second board 13. The second board 13 includes a second circuit 14, pads 40b connected to the front end of the second circuit 14, and connector pins 60b connected to the back end of the second circuit 14. The pads 40b and the connector pins 60b are provided on the first surface 13A and the second surface 13B of the second board 13. For example, the thickness of the second board 13 is between 0.5 mm and 1.0 mm.

Figure 2:
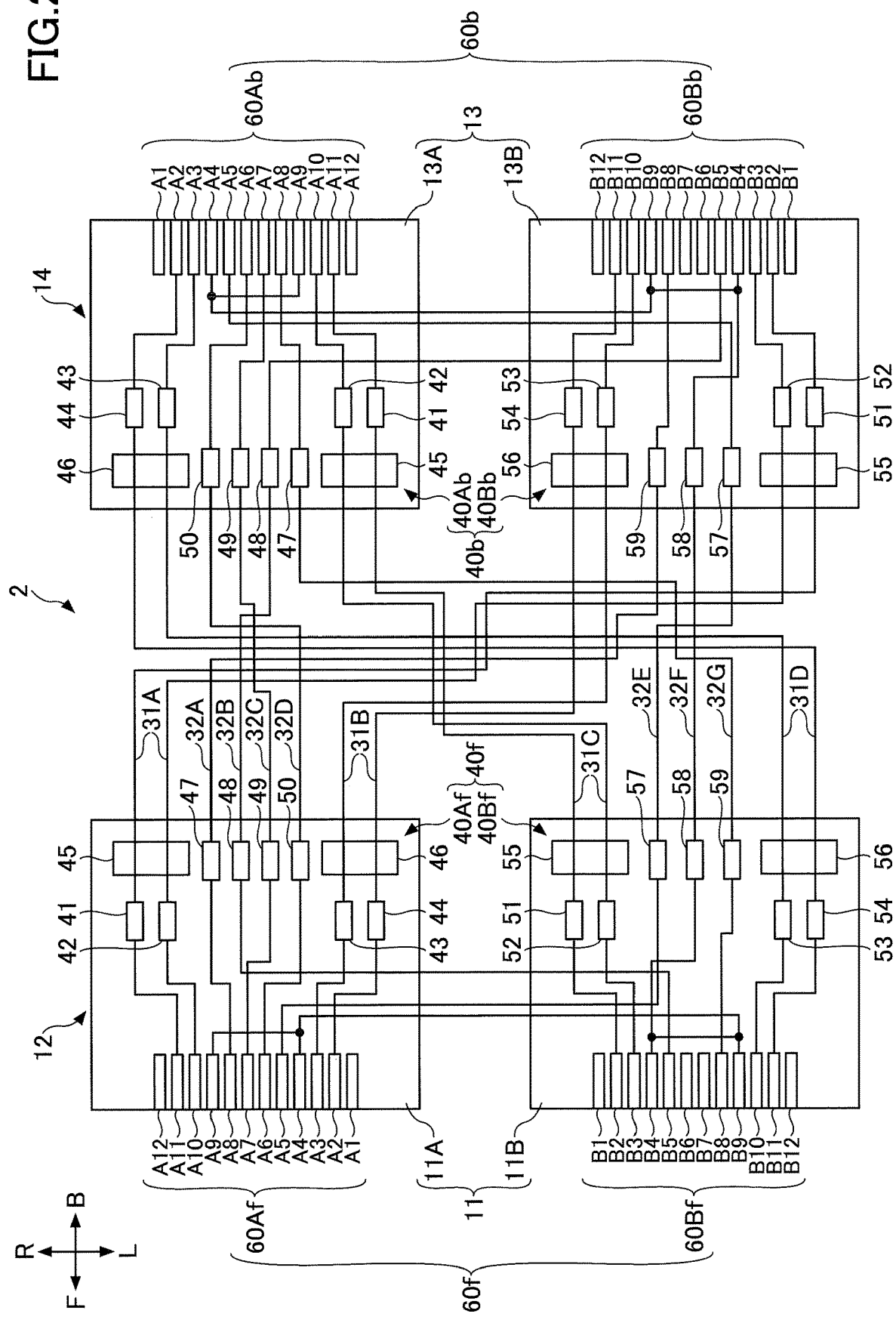
FIG. 2 is a drawing illustrating electrical connections in a connector-cable module according to the embodiment.

FIG. 2 is a drawing illustrating electrical connections in the connector-cable module 1. As illustrated in FIG. 2, the multicore cable 2 includes coaxial wire pairs 31A, 31B, 31C and 31D that are high-speed signal lines, and wires 32A, 32B, 32C, 32D, 32E, 32F, and 32G. For example, the wire 32C and the wire 32D are stranded. Each of the coaxial wire pairs 31A-31D consists of a pair of coaxial wires to transmit a high-speed differential signal. Each of the coaxial wires constituting the coaxial wire pairs 31A-31D includes a central conductor, an insulating layer, an outer conductor, and a casing that are arranged in this order from the center to the outer side. Each of the wires 32A-32G is implemented by an insulated wire including a central conductor and a casing. The wire 32C is an example of a first signal line, the wire 32D is an example of a second signal line, and the wire 32G is an example of a third signal line.

FIG. 2 illustrates the upper surface (the first surface 11A) of the first board 11 and the upper surface (the first surface 13A) of the second board 13 that are seen from a position above the connector-cable module 1. FIG. 2 also illustrates the lower surface (the second surface 11B) of the first board 11 and the lower surface (the second surface 13B) of the second board 13, which are seen through from above, along with the upper surfaces (the first surfaces 11A and 13A). Each of the first board 11 and the second board 13 has a substantially flat shape.

The pads 40f on the first board 11 include first-surface pads 40Af provided on the first surface 11A and second-surface pads 40Bf provided on the second surface 11B. The first-surface pads 40Af include a first pad 41, a second pad 42, a third pad 43, a fourth pad 44, a fifth pad 45, a sixth pad 46, a seventh pad 47, an eighth pad 48, a ninth pad 49, and a tenth pad 50. The second-surface pads 40Bf include a first pad 51, a second pad 52, a third pad 53, a fourth pad 54, a fifth pad 55, a sixth pad 56, a seventh pad 57, an eighth pad 58, and a ninth pad 59. Details of the arrangement of the pads 41-59 included in the pads 40f are described later.

Figure 3:
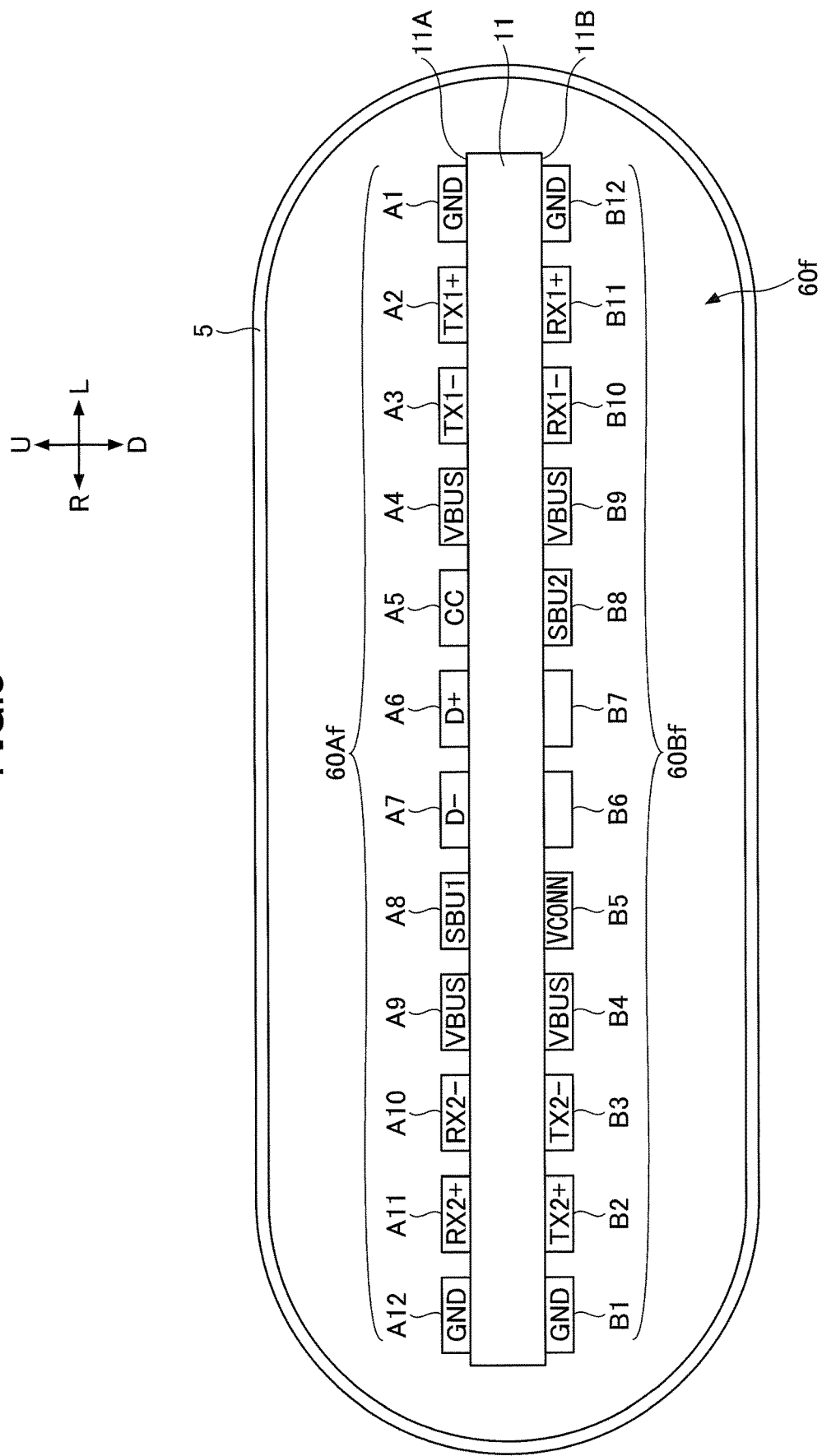
FIG. 3 is a drawing illustrating connector pins provided on a first board.

The connector pins 60f on the first board 11 include first-surface connector pins 60Af provided on the first surface 11A and second-surface connector pins 60Bf provided on the second surface 11B. FIG. 3 illustrates the connector pins 60f provided on the first board 11.

The first-surface connector pins 60Af include a first connector pin A1, a second connector pin A2, a third connector pin A3, a fourth connector pin A4, a fifth connector pin A5, a sixth connector pin A6, a seventh connector pin A7, an eighth connector pin A8, a ninth connector pin A9, a tenth connector pin A10, an eleventh connector pin A11, and a twelfth connector pin A12. The connector pins A1-A12 are arranged sequentially in a row from left to right on the first surface 11A.

The second-surface connector pins 60Bf include a first connector pin B1, a second connector pin B2, a third connector pin B3, a fourth connector pin B4, a fifth connector pin B5, a sixth connector pin B6, a seventh connector pin B7, an eighth connector pin B8, a ninth connector pin B9, a tenth connector pin B10, an eleventh connector pin B11, and a twelfth connector pin B12. The connector pins B1-B12 are arranged sequentially in a row from right to left on the second surface 11B.

Among the first-surface connector pins 60Af, the first connector pin A1 and the twelfth connector pin A12 are ground terminals (GND). The second connector pin A2 and the third connector pin A3 are high-speed signal transmission terminals (TX1+, TX1−). The fourth connector pin A4 and the ninth connector pin A9 are bus-power-supply terminals (VBUS). The fifth connector pin A5 is a configuration channel terminal (CC). The sixth connector pin A6 and the seventh connector pin A7 are data-signal terminals (D+, D−). The eighth connector pin A8 is a sideband terminal (SBU1). The tenth connector pin A10 and the eleventh connector pin A11 are high-speed signal reception terminals (RX2+, RX2−).

Among the second-surface connector pins 60Bf, the first connector pin B1 and the twelfth connector pin B12 are ground terminals (GND). The second connector pin B2 and the third connector pin B3 are high-speed signal transmission terminals (TX2+, TX2−). The fourth connector pin B4 and the ninth connector pin B9 are bus-power-supply terminals (VBUS). The fifth connector pin B5 is a connected-power-supply terminal (VCONN). The eighth connector pin B8 is a sideband terminal (SBU2). The tenth connector pin B10 and the eleventh connector pin B11 are high-speed signal reception terminals (RX1+, RX1−).

The first-surface pads 40Af and the second-surface pads 40Bf are connected to the front end of the multicore cable 2.

Specifically, the coaxial wire pair 31A is connected to the first pad 41 and the second pad 42 on the first surface 11A. The coaxial wire pair 31B is connected to the third pad 43 and the fourth pad 44 on the first surface 11A. The coaxial wire pair 31C is connected to the first pad 51 and the second pad 52 on the second surface 11B. The coaxial wire pair 31D is connected to the third pad 53 and the fourth pad 54 on the second surface 11B.

The wire 32A is connected to the seventh pad 47 on the first surface 11A. The wire 32B is connected to the eighth pad 48 on the first surface 11A. The wire 32C is connected to the ninth pad 49 on the first surface 11A. The wire 32D is connected to the tenth pad 50 on the first surface 11A. The wire 32E is connected to the seventh pad 57 on the second surface 11B. The wire 32F is connected to the eighth pad 58 on the second surface 11B. The wire 32G is connected to the ninth pad 59 on the second surface 11B.

The first-surface pads 40Af and the second-surface pads 40Bf are connected via the first circuit 12 to the first-surface connector pins 60Af and the second-surface connector pins 60Bf on the first board 11.

Specifically, the first pad 41 is connected to the eleventh connector pin A11 on the first surface 11A. The second pad 42 is connected to the tenth connector pin A10 on the first surface 11A. The third pad 43 is connected to the third connector pin A3 on the first surface 11A. The fourth pad 44 is connected to the second connector pin A2 on the first surface 11A. The seventh pad 47 is connected to the eighth connector pin A8 on the first surface 11A. The eighth pad 48 is connected to the fifth connector pin B5 on the second surface 11B. The ninth pad 49 is connected to the seventh connector pin A7 on the first surface 11A. The tenth pad 50 is connected to the sixth connector pin A6 on the first surface 11A.

The first pad 51 is connected to the second connector pin B2 on the second surface 11B. The second pad 52 is connected to the third connector pin B3 on the second surface 11B. The third pad 53 is connected to the tenth connector pin B10 on the second surface 11B. The fourth pad 54 is connected to the eleventh connector pin B11 on the second surface 11B. The seventh pad 57 is connected to the fifth connector pin A5 on the first surface 11A. The eighth pad 58 is connected to the fourth connector pin A4 on the first surface 11A, the ninth connector pin A9 on the first surface 11A, the fourth connector pin B4 on the second surface 11B, and the ninth connector pin B9 on the second surface 11B. The ninth pad 59 is connected to the eighth connector pin B8 on the second surface 11B.

Further, the fifth pad 45, the sixth pad 46, the fifth pad 55, and the sixth pad 56 are connected to the first connector pin A1 on the first surface 11A, the twelfth connector pin A12 on the first surface 11A, the first connector pin B1 on the second surface 11B, and the twelfth connector pin B12 on the second surface 11B.

The pads 40b on the second board 13 include first-surface pads 40Ab provided on the first surface 13A and second-surface pads 40Bb provided on the second surface 13B. The first-surface pads 40Ab include a first pad 41, a second pad 42, a third pad 43, a fourth pad 44, a fifth pad 45, a sixth pad 46, a seventh pad 47, an eighth pad 48, a ninth pad 49, and a tenth pad 50. The second-surface pads 40Bb include a first pad 51, a second pad 52, a third pad 53, a fourth pad 54, a fifth pad 55, a sixth pad 56, a seventh pad 57, an eighth pad 58, and a ninth pad 59. Details of the arrangement of the pads 41-59 included in the pads 40b are described later.

The connector pins 60b on the second board 13 include first-surface connector pins 60Ab provided on the first surface 13A and second-surface connector pins 60Bb provided on the second surface 13B.

The first-surface connector pins 60Ab include a first connector pin A1, a second connector pin A2, a third connector pin A3, a fourth connector pin A4, a fifth connector pin A5, a sixth connector pin A6, a seventh connector pin A7, an eighth connector pin A8, a ninth connector pin A9, a tenth connector pin A10, an eleventh connector pin A11, and a twelfth connector pin A12. The connector pins A1-A12 are arranged sequentially in a row from right to left on the first surface 13A.

The second-surface connector pins 60Bb include a first connector pin B1, a second connector pin B2, a third connector pin B3, a fourth connector pin B4, a fifth connector pin B5, a sixth connector pin B6, a seventh connector pin B7, an eighth connector pin B8, a ninth connector pin B9, a tenth connector pin B10, an eleventh connector pin B11, and a twelfth connector pin B12. The connector pins B1-B12 are arranged sequentially in a row from left to right on the second surface 13B.

Among the first-surface connector pins 60Ab, the first connector pin A1 and the twelfth connector pin A12 are ground terminals (GND). The second connector pin A2 and the third connector pin A3 are high-speed signal transmission terminals (TX1+, TX1−). The fourth connector pin A4 and the ninth connector pin A9 are bus-power-supply terminals (VBUS). The fifth connector pin A5 is a configuration channel terminal (CC). The sixth connector pin A6 and the seventh connector pin A7 are data-signal terminals (D+, D−). The eighth connector pin A8 is a sideband terminal (SBU1). The tenth connector pin A10 and the eleventh connector pin A11 are high-speed signal reception terminals (RX2+, RX2−).

Among the second-surface connector pins 60Bb, the first connector pin B1 and the twelfth connector pin B12 are ground terminals (GND). The second connector pin B2 and the third connector pin B3 are high-speed signal transmission terminals (TX2+, TX2−). The fourth connector pin B4 and the ninth connector pin B9 are bus-power-supply terminals (VBUS). The fifth connector pin B5 is a connected-power-supply terminal (VCONN). The eighth connector pin B8 is a sideband terminal (SBU2). The tenth connector pin B10 and the eleventh connector pin B11 are high-speed signal reception terminals (RX1+, RX1−).

The first-surface pads 40Ab and the second-surface pads 40Bb are connected to the back end of the multicore cable 2.

Specifically, the coaxial wire pair 31A is connected to the first pad 51 and the second pad 52 on the second surface 13B. The coaxial wire pair 318 is connected to the third pad 53 and the fourth pad 54 on the second surface 13B. The coaxial wire pair 31C is connected to the first pad 41 and the second pad 42 on the first surface 13A. The coaxial wire pair 31D is connected to the third pad 43 and the fourth pad 44 on the first surface 13A.

The wire 32A is connected to the ninth pad 59 on the second surface 13B. The wire 32B is connected to the eighth pad 48 on the first surface 13A. The wire 32C is connected to the ninth pad 49 on the first surface 13A. The wire 32D is connected to the tenth pad 50 on the first surface 13A. The wire 32E is connected to the seventh pad 57 on the second surface 13B. The wire 32F is connected to the eighth pad 58 on the second surface 13B. The wire 32G is connected to the seventh pad 47 on the first surface 13A.

The first-surface pads 40Ab and the second-surface pads 40Bb are connected via the second circuit to the first-surface connector pins 60Ab and the second-surface connector pins 60Bb on the second board 13.

Specifically, the first pad 41 is connected to the eleventh connector pin A11 on the first surface 13A. The second pad 42 is connected to the tenth connector pin A10 on the first surface 13A. The third pad 43 is connected to the third connector pin A3 on the first surface 13A. The fourth pad 44 is connected to the second connector pin A2 on the first surface 13A. The seventh pad 47 is connected to the eighth connector pin A8 on the first surface 13A. The eighth pad 48 is connected to the fifth connector pin B5 on the second surface 13B. The ninth pad 49 is connected to the seventh connector pin A7 on the first surface 13A. The tenth pad 50 is connected to the sixth connector pin A6 on the first surface 13A.

The first pad 51 is connected to the second connector pin B2 on the second surface 13B. The second pad 52 is connected to the third connector pin B3 on the second surface 13B. The third pad 53 is connected to the tenth connector pin B10 on the second surface 13B. The fourth pad 54 is connected to the eleventh connector pin B11 on the second surface 13B. The seventh pad 57 is connected to the fifth connector pin A5 on the first surface 13A. The eighth pad 58 is connected to the fourth connector pin A4 on the first surface 13A, the ninth connector pin A9 on the first surface 13A, the fourth connector pin B4 on the second surface 13B, and the ninth connector pin B9 on the second surface 13B. The ninth pad 59 is connected to the eighth connector pin B8 on the second surface 13B.

Further, the fifth pad 45, the sixth pad 46, the fifth pad 55, and the sixth pad 56 are connected to the first connector pin A1 on the first surface 13A, the twelfth connector pin A12 on the first surface 13A, the first connector pin B1 on the second surface 13B, and the twelfth connector pin B12 on the second surface 13B.

Figure 4A:
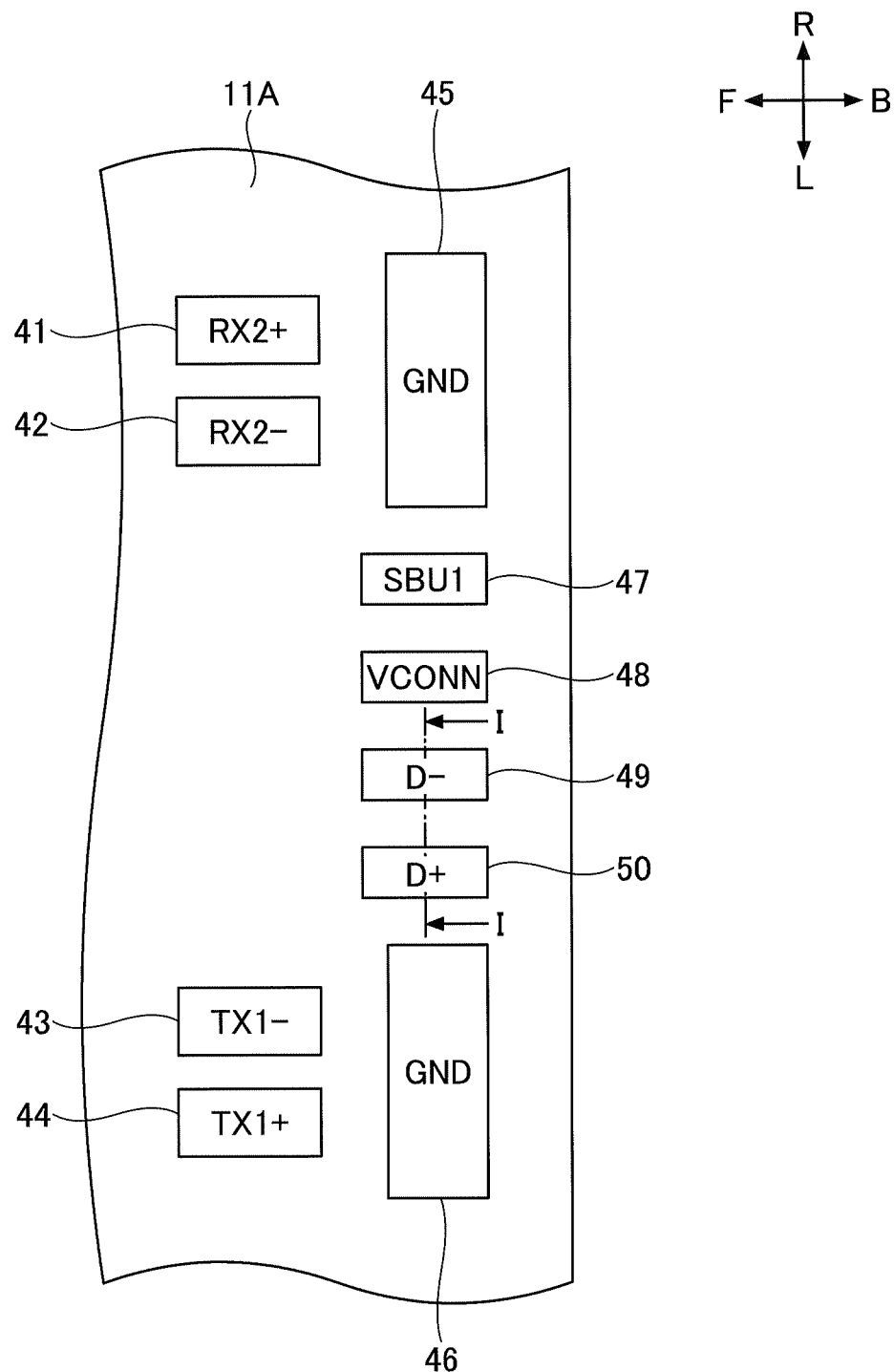
FIG. 4A is a top view illustrating an arrangement of pads according to the embodiment.
Figure 4B:
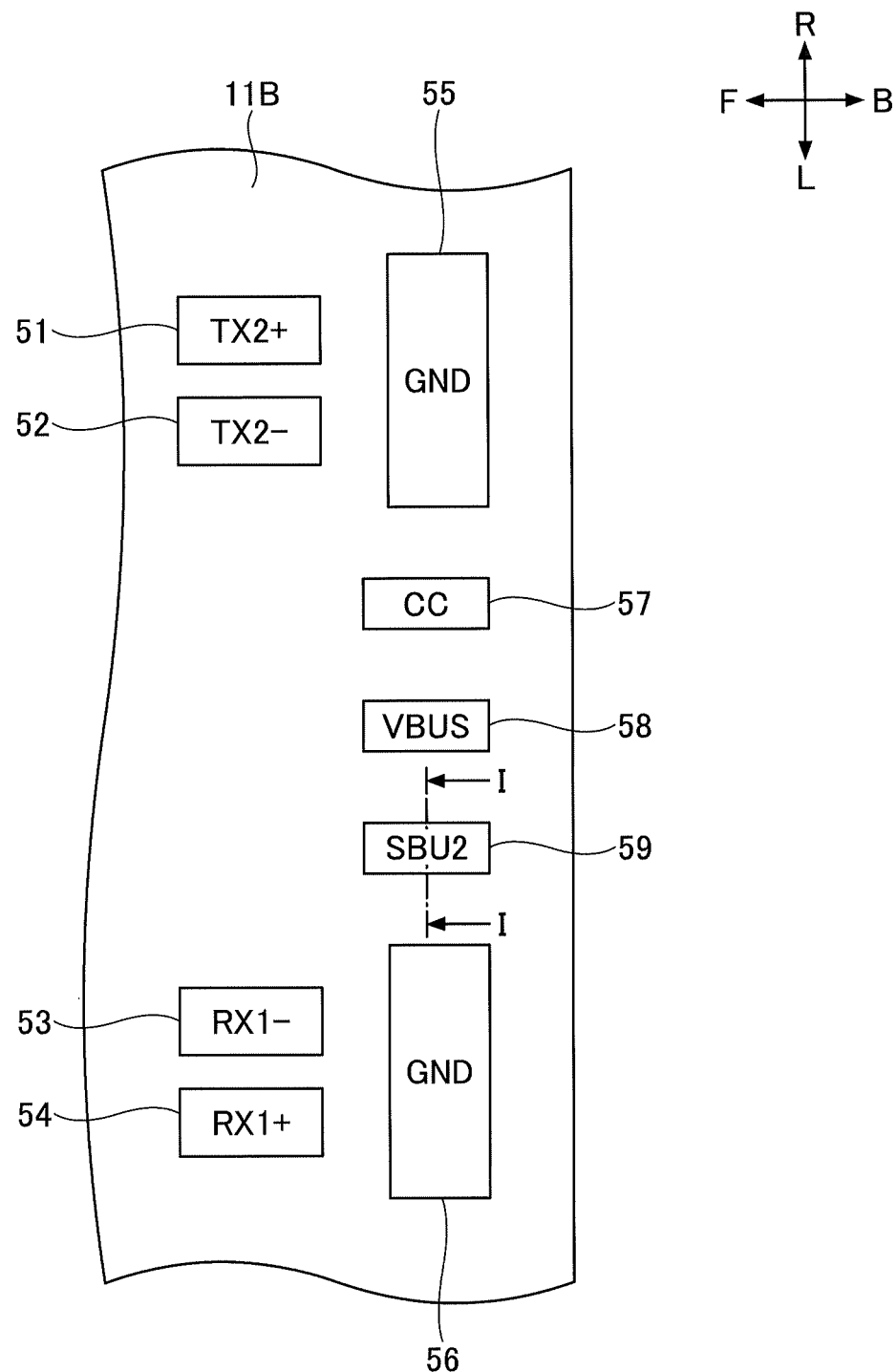
FIG. 4B is a top view illustrating an arrangement of other pads according to the embodiment.
Figure 4C:
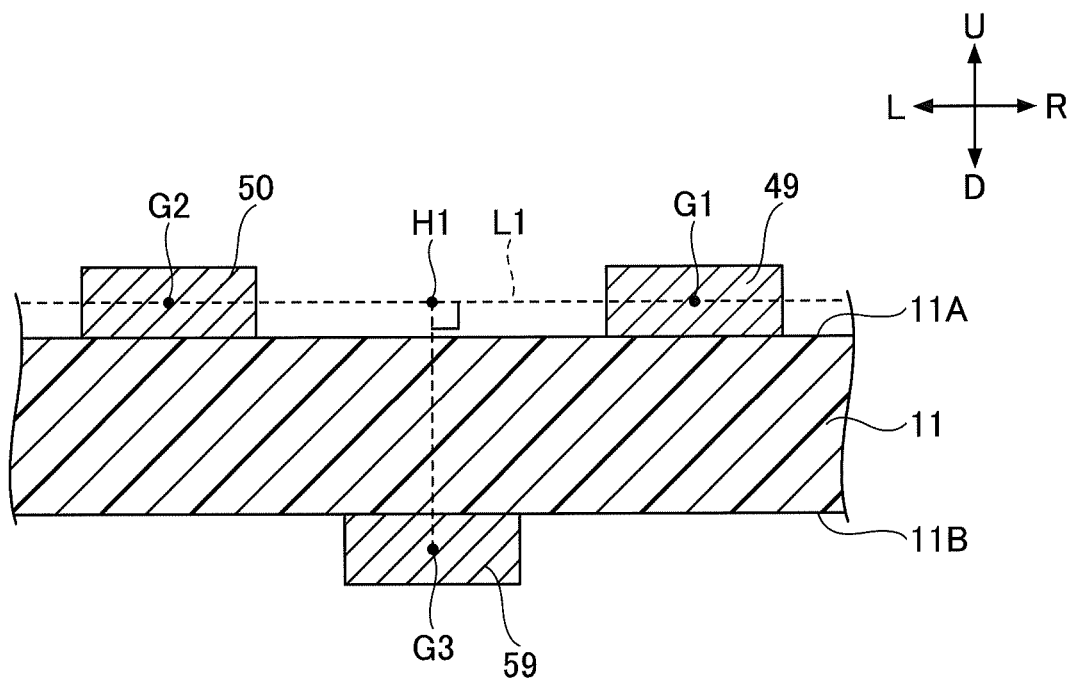
FIG. 4C is a cross-sectional view illustrating an arrangement of pads according to the embodiment.

Here, the arrangement of the pads 41-59 included in the pads 40f is described. FIG. 4A is a drawing illustrating the arrangement of the pads 41-50. FIG. 4B is a drawing illustrating the arrangement of the pads 51-50. FIG. 4C is a cross-sectional view illustrating the arrangement of the ninth pad 49, the tenth pad 50, and the ninth pad 59. FIG. 4C corresponds to a cross section taken along line I-I in FIGS. 4A and 4B.

As illustrated in FIG. 4A, on the first surface 11A, the sixth pad 46 is provided to the left of the fifth pad 45, and the seventh pad 47, the eighth pad 48, the ninth pad 49, and the tenth pad 50 are arranged in this order from right to left between the fifth pad 45 and the sixth pad 46. For example, the size of each of the fifth pad 45 and the sixth pad 46 in the RL direction is between 2.0 mm and 3.0 mm, and the size of each of the seventh pad 47, the eighth pad 48, the ninth pad 49, and the tenth pad 50 in the RL direction is between 0.3 mm and 0.5 mm. For example, each of the distance between the fifth pad 45 and the seventh pad 47 and the distance between the sixth pad 46 and the tenth pad 50 is between 0.5 mm and 0.6 mm. For example, each of the distance between the seventh pad 47 and the eighth pad 48, the distance between the eighth pad 48 and the ninth pad 49, and the distance between the ninth pad 49 and the tenth pad 50 is between 0.4 mm and 0.5 mm.

As illustrated in FIG. 4A, on the first surface 11A, the first pad 41 and the second pad 42 are provided in front of the fifth pad 45, and the third pad 43 and the fourth pad 44 are provided in front of the sixth pad 46. For example, each of the distance between the first pad 41 and the second pad 42 and the distance between the third pad 43 and the fourth pad 44 is between 0.3 mm and 0.4 mm.

As illustrated in FIG. 4B, on the second surface 11B, the sixth pad 56 is provided to the left of the fifth pad 55, and the seventh pad 57, the eighth pad 58, and the ninth pad 59 are arranged in this order from right to left between the fifth pad 55 and the sixth pad 56. For example, the size of each of the fifth pad 55 and the sixth pad 56 in the RL direction is between 2.0 mm and 3.0 mm, the size of each of the seventh pad 57 and the ninth pad 59 in the RL direction is between 0.3 mm and 0.5 mm, and the size of the eighth pad 58 in the RL direction is between 1.0 mm and 1.2 mm. For example, each of the distance between the fifth pad 55 and the seventh pad 57 and the distance between the sixth pad 56 and the ninth pad 59 is between 0.5 mm and 0.8 mm. For example, each of the distance between the seventh pad 57 and the eighth pad 58 and the distance between the eighth pad 58 and the ninth pad 59 is between 0.4 mm and 0.5 mm.

As illustrated in FIG. 4B, on the second surface 11B, the first pad 51 and the second pad 52 are provided in front of the fifth pad 55, and the third pad 53 and the fourth pad 54 are provided in front of the sixth pad 46. For example, each of the distance between the first pad 51 and the second pad 52 and the distance between the third pad 53 and the fourth pad 54 is between 0.3 mm and 0.4 mm.

As illustrated in FIG. 4C, when focusing on the ninth pad 49 and the tenth pad 50 on the first surface 11A and the ninth pad 59 on the second surface 11B, the following positional relationship is satisfied in the present embodiment. That is, a foot of a perpendicular H1 drawn from a gravity center G3 of the ninth pad 59 to a line L1, which passes through a gravity center G1 of the ninth pad 49 and a gravity center G2 of the tenth pad 50, is located at the midpoint of a line segment connecting the gravity center G1 and the gravity center G2. The gravity center G1 of the ninth pad 49 is an example of a first gravity center of a first pad, the gravity center G2 of the tenth pad 50 is an example of a second gravity center of a second pad, and the gravity center G3 of the ninth pad 59 is an example of a third gravity center of a third pad.

The positional relationship among the pads 41-50 of the pads 40b on the first surface 13A is substantially the same as the positional relationship among the pads 41-50 of the pads 40f on the first surface 11A. Also, the positional relationship among the pads 51-59 of the pads 40b on the second surface 13B is substantially the same as the positional relationship among the pads 51-59 of the pads 40f on the second surface 11B.

That is, on the first surface 13A, the sixth pad 46 is provided to the right of the fifth pad 45, and the seventh pad 47, the eighth pad 48, the ninth pad 49, and the tenth pad 50 are arranged in this order from left to right between the fifth pad 45 and the sixth pad 46. For example, the size of each of the fifth pad 45 and the sixth pad 46 in the RL direction is between 2.0 mm and 3.0 mm, and the size of each of the seventh pad 47, the eighth pad 48, the ninth pad 49, and the tenth pad 50 in the RL direction is between 0.3 mm and 0.5 mm. For example, each of the distance between the fifth pad 45 and the seventh pad 47 and the distance between the sixth pad 46 and the tenth pad 50 is between 0.5 mm and 0.6 mm. For example, each of the distance between the seventh pad 47 and the eighth pad 48, the distance between the eighth pad 48 and the ninth pad 49, and the distance between the ninth pad 49 and the tenth pad 50 is between 0.4 mm and 0.5 mm.

Also, on the first surface 13A, the first pad 41 and the second pad 42 are provided behind the fifth pad 45, and the third pad 43 and the fourth pad 44 are provided behind the sixth pad 46. For example, each of the distance between the first pad 41 and the second pad and the distance between the third pad 43 and the fourth pad 44 is between 0.3 mm and 0.4 mm.

On the second surface 13B, the sixth pad 56 is provided to the right of the fifth pad 55, and the seventh pad 57, the eighth pad 58, and the ninth pad 59 are arranged in this order from left to right between the fifth pad 55 and the sixth pad 56. For example, the size of each of the fifth pad 55 and the sixth pad 56 in the RL direction is between 2.0 mm and 3.0 mm, the size of each of the seventh pad 57 and the ninth pad 59 in the RL direction is between 0.3 mm and 0.5 mm, and the size of the eighth pad 58 in the RL direction is between 1.0 mm and 1.2 mm. For example, each of the distance between the fifth pad 55 and the seventh pad 57 and the distance between the sixth pad 56 and the ninth pad 59 is between 0.5 mm and 0.8 mm. For example, each of the distance between the seventh pad 57 and the eighth pad 58 and the distance between the eighth pad 58 and the ninth pad 59 is between 0.4 mm and 0.5 mm.

Also, on the second surface 13B, the first pad 51 and the second pad 52 are provided behind the fifth pad 55, and the third pad 53 and the fourth pad 54 are provided behind the sixth pad 56. For example, each of the distance between the first pad 51 and the second pad and the distance between the third pad 53 and the fourth pad 54 is between 0.3 mm and 0.4 mm.

Also, although the illustration is omitted, similarly to the first connector 3, when focusing on the ninth pad 49 and the tenth pad 50 on the first surface 13A and the ninth pad 59 on the second surface 13B, the following positional relationship is satisfied in the present embodiment. That is, a foot of a perpendicular H1 drawn from a gravity center G3 of the ninth pad 59 to a line, which passes through a gravity center G1 of the ninth pad 49 and a gravity center G2 of the tenth pad 50, is located at the midpoint of a line segment connecting the gravity center G1 and the gravity center G2.

The connector-cable module 1 of the present embodiment is configured as described above. As described above, in the first connector 3 and the second connector 4, the ninth pad 49 is connected to the seventh connector pin A7, and the seventh connector pin A7 is a data signal terminal (D−). The tenth pad 50 is connected to the sixth connector pin A6, and the sixth connector pin A6 is a data signal terminal (D+). The ninth pad 59 is connected to the eighth connector pin B8, and the eighth connector pin B8 is a sideband terminal (SBU2). A negative data signal (D−) flowing through the ninth pad 49 is an example of a first signal, a positive data signal (D+) flowing through the tenth pad 50 is an example of a second signal, and a signal flowing through the ninth pad 59 is an example of a third signal.

Figure 5:
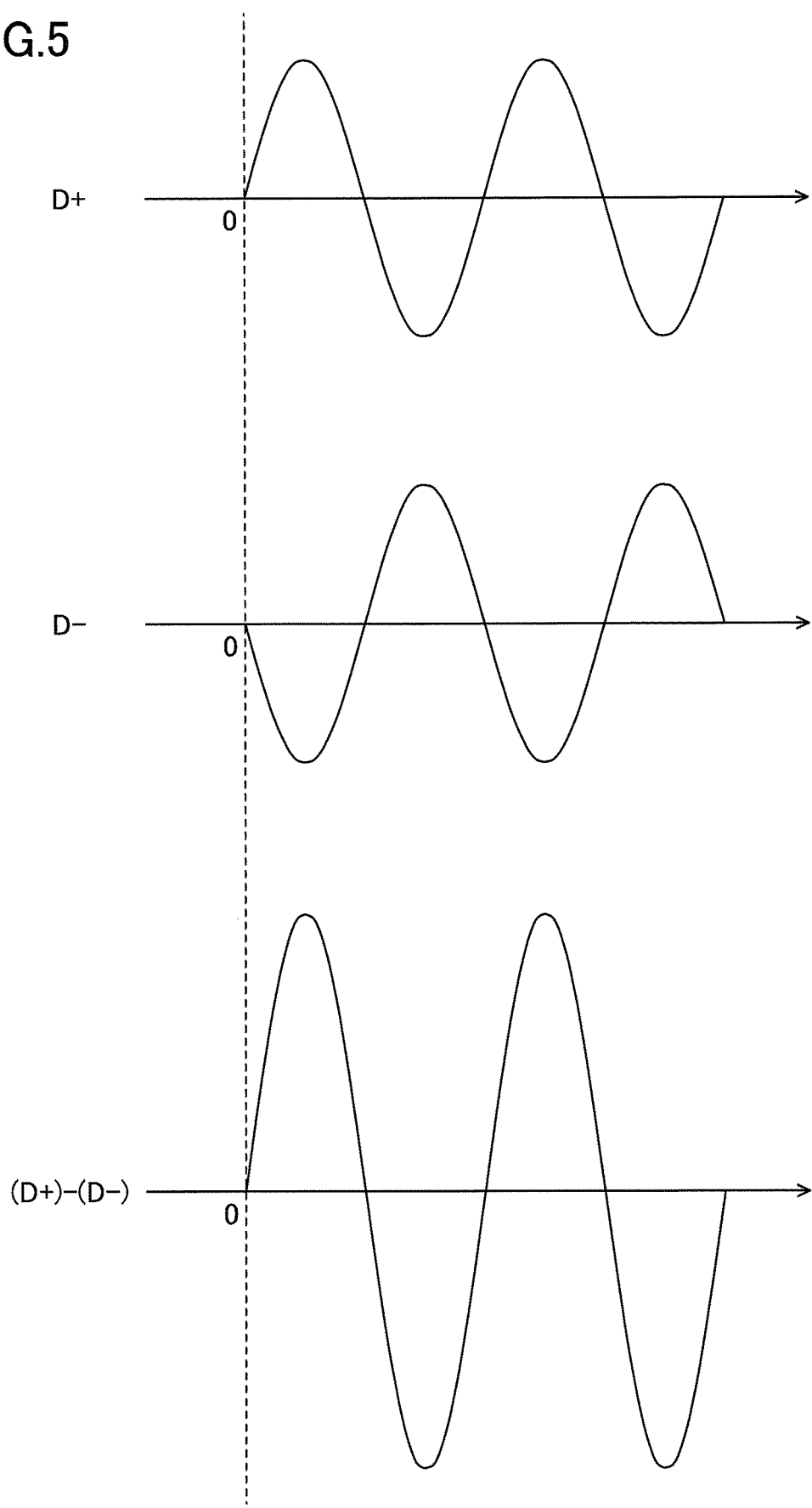
FIG. 5 is a drawing illustrating changes in data signals according to the embodiment.
Figure 6:
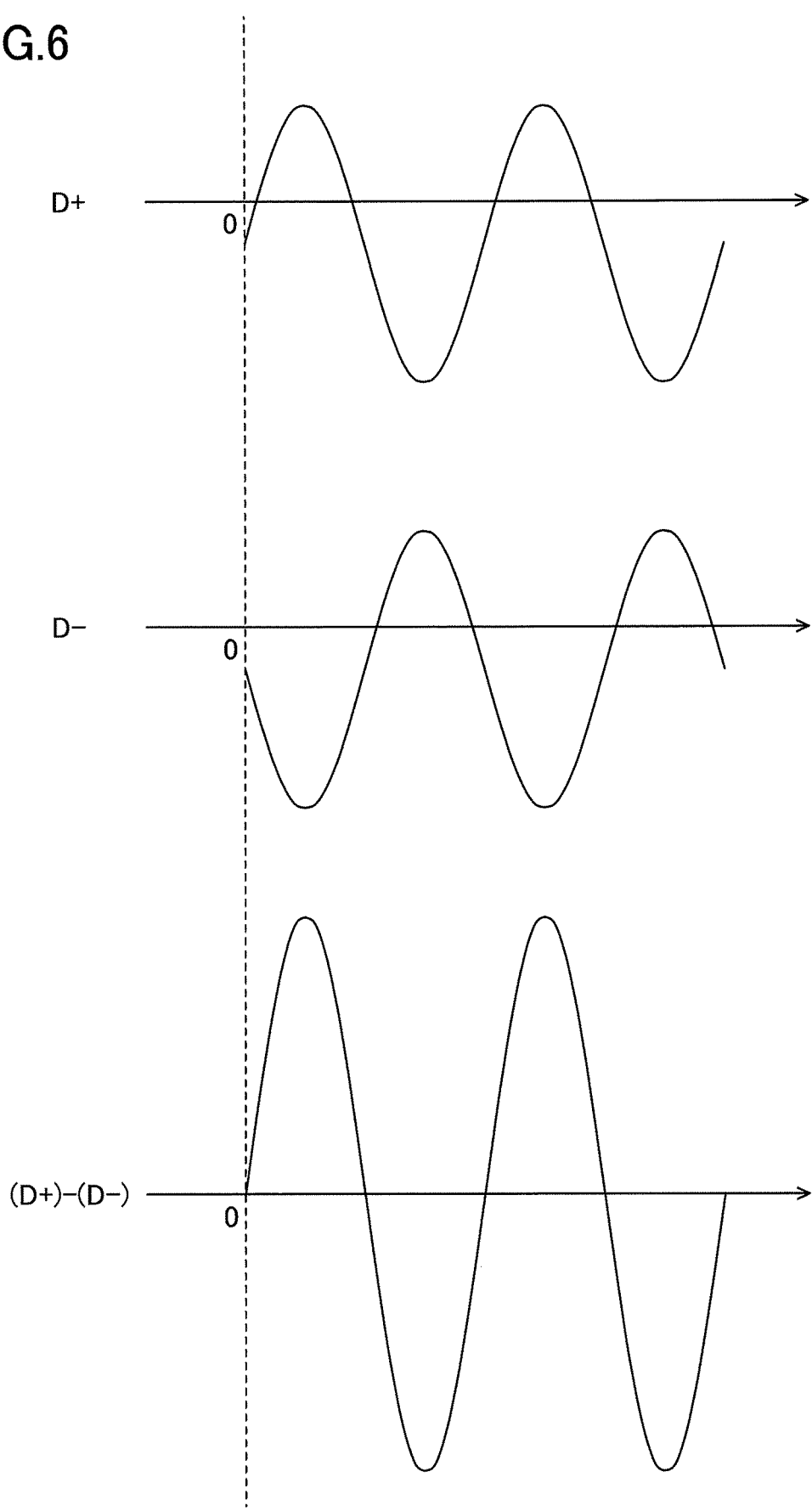
FIG. 6 is a drawing illustrating changes in data signals according to the embodiment.

Because the ninth pad 49 and the tenth pad 50 are located close to the ninth pad 59, crosstalk may occur between the ninth pad 49 and the ninth pad 59 and between the tenth pad 50 and the ninth pad 59. Here, crosstalk in the present embodiment is described. FIGS. 5 and 6 are drawings illustrating changes in data signals. FIG. 5 illustrates changes in data signals observed when no crosstalk is present, and FIG. 6 illustrates changes in data signals observed when crosstalk is present.

As illustrated in FIG. 5, phase-inverted differential signals flow into the ninth pad 49 and the tenth pad 50 via the wire 32C and the wire 32D that constitute a stranded wire. A stranded wire is suitable for transmission of differential signals. A data signal can be accurately transmitted by calculating a difference between the positive data signal (D+) and the negative data signal (D−).

When crosstalk occurs, as illustrated in FIG. 6, the negative data signal (D−) flowing through the ninth pad 49 changes in the positive or negative direction (in the negative direction in the example of FIG. 6). The tenth pad 50 is apart from the ninth pad 59 by the same distance as the ninth pad 49. Accordingly, the positive data signal (D+) flowing through the tenth pad 50 changes by the same amount in the same direction as the negative data signal (D−) flowing through the ninth pad 49. Therefore, even when crosstalk occurs as illustrated in FIG. 6, by calculating a difference between the positive data signal (D+) and the negative data signal (D−), it is possible to cancel the crosstalk component, to reduce noise resulting from the crosstalk, and to accurately transmit a data signal.

In the present embodiment, the ninth pad 59 is provided on a surface that is different from a surface on which the ninth pad 49 and the tenth pad 50 are provided, and the ninth pad 49 and the tenth pad 50 are arranged next to each other. This configuration makes it possible to reliably transmit a data signal as a differential signal.

The ninth pad 49 and the ninth pad 59 are at such a distance from each other that crosstalk occurs, and the tenth pad 50 and the ninth pad 59 are also at such a distance that crosstalk occurs. On the other hand, the seventh pad 47 for a sideband is sufficiently apart from the ninth pad 49 and the tenth pad 50. Therefore, crosstalk does not occur between a signal flowing through the seventh pad 47 and a data signal or even if crosstalk occurs, the crosstalk is negligible.

Figure 7:
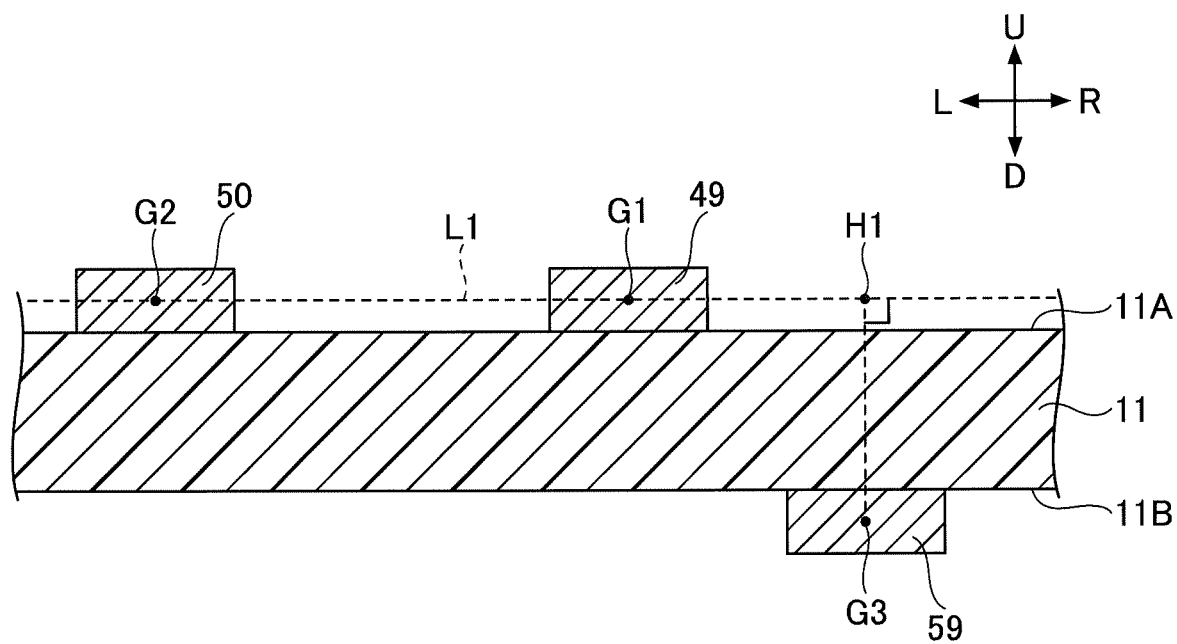
FIG. 7 is a cross-sectional view illustrating an arrangement of pads according to a reference example.
Figure 8:
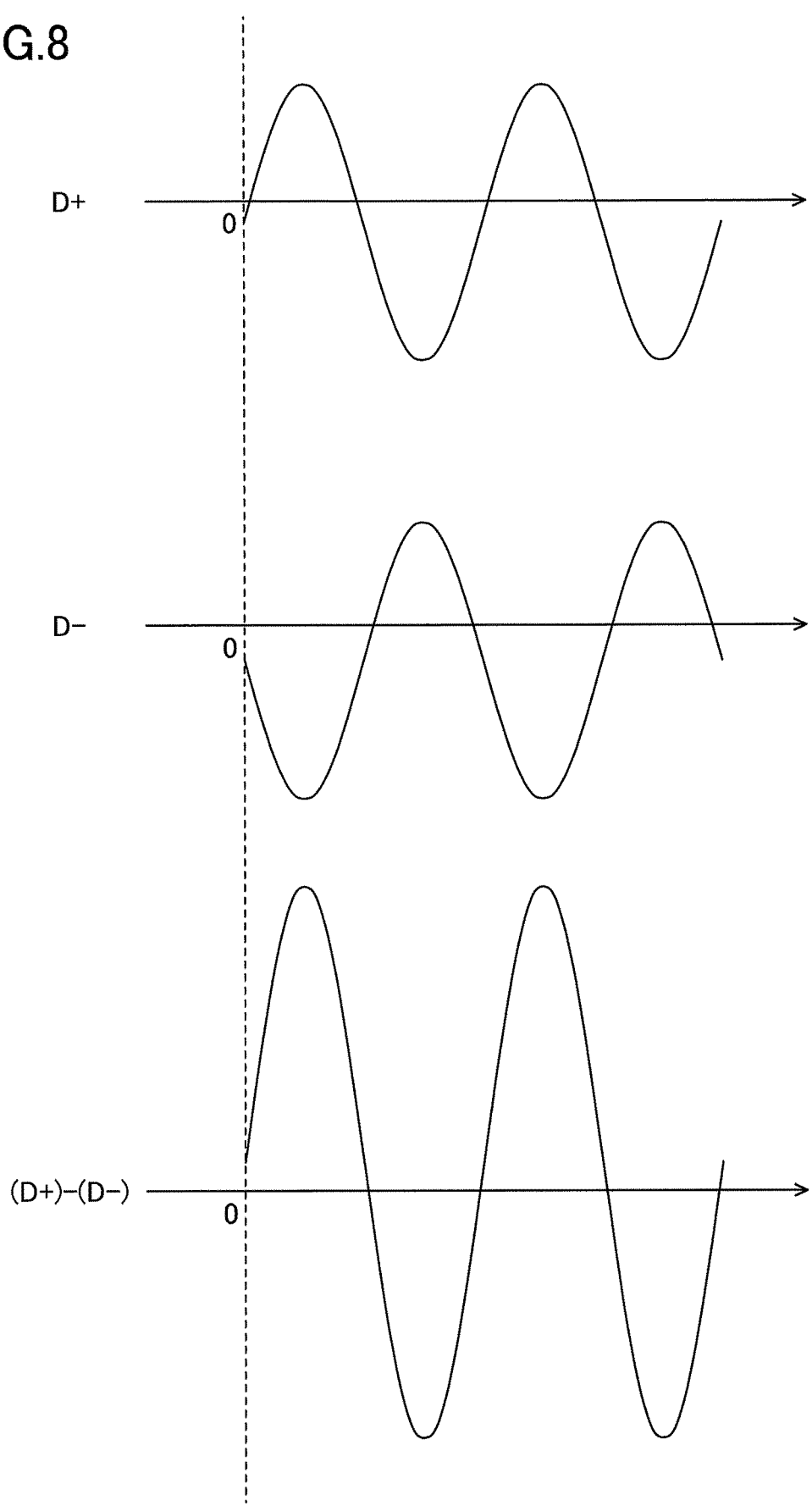
FIG. 8 is a drawing illustrating changes in data signals according to the reference example.

Next, an influence of crosstalk in a reference example is described. FIG. 7 is a cross-sectional view illustrating an arrangement of the ninth pad 49, the tenth pad 50, and the ninth pad 59 in the reference example. FIG. 8 is a drawing illustrating changes in data signals according to the reference example. FIG. 8 illustrates changes in data signals observed when crosstalk is present. In this reference example, a foot of a perpendicular H1 drawn from the gravity center G3 of the ninth pad 59 to the line L1, which passes through the gravity center G1 of the ninth pad 49 and the gravity center G2 of the tenth pad 50, is located outside of the gravity center G1.

Even in this reference example, when no crosstalk is present, phase-inverted differential signals flow through the ninth pad 49 and the tenth pad as illustrated in FIG. 5. A data signal can be accurately transmitted by calculating a difference between the positive data signal (D+) and the negative data signal (D−).

However, when crosstalk occurs, as illustrated in FIG. 8, the negative data signal (D−) flowing through the ninth pad 49 changes in the positive or negative direction (in the negative direction in the example of FIG. 8). In the reference example, the distance between the tenth pad 50 and the ninth pad 59 is greater than the distance between the ninth pad 49 and the ninth pad 59. Therefore, the positive data signal (D+) flowing through the tenth pad 50 does not change as much as the negative data signal (D−) flowing through the ninth pad 49. For this reason, as illustrated in FIG. 8, when crosstalk occurs, the crosstalk component cannot be canceled as in the embodiment, and the transmitted data signal contains noise.

Figure 9:
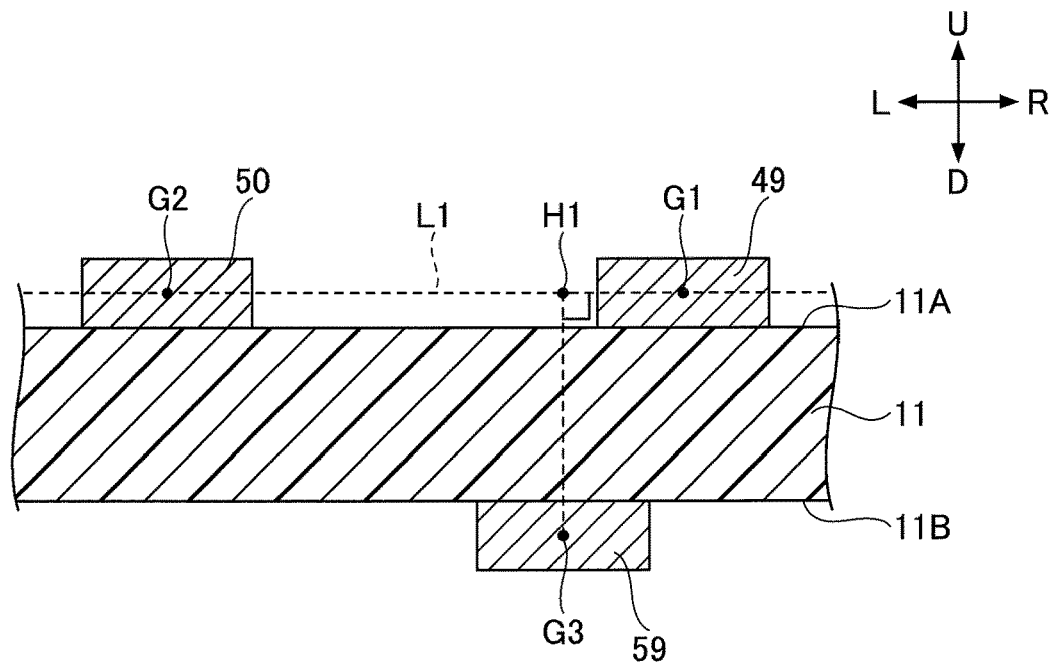
FIG. 9 is a cross-sectional view illustrating an arrangement of pads according to a first variation of the embodiment.

In the above embodiment, the foot of the perpendicular H1 drawn from the gravity center G3 to the line L1 passing through the gravity center G1 and the gravity center G2 may not necessarily be located at the midpoint of the line segment connecting the gravity center G1 and the gravity center G2 as long as the foot of the perpendicular H1 is located between the gravity center G1 and the gravity center G2. FIG. 9 is a cross-sectional view illustrating an arrangement of the ninth pad 49, the tenth pad 50, and the ninth pad 59 according to a first variation of the embodiment. For example, as illustrated in FIG. 9, the foot of the perpendicular H1 may be located between the gravity center G1 and the gravity center G2 at a position closer to the gravity center G1 than the midpoint. Also, the foot of the perpendicular H1 may be located between the gravity center G1 and the gravity center G2 at a position closer to the gravity center G2 than the midpoint.

Even if the foot of the perpendicular H1 is shifted from the midpoint of the line segment connecting the gravity center G1 and the gravity center G2, noise resulting from crosstalk can be reduced as long as the foot of the perpendicular H1 is located between the gravity center G1 and the gravity center G2.

Figure 10:
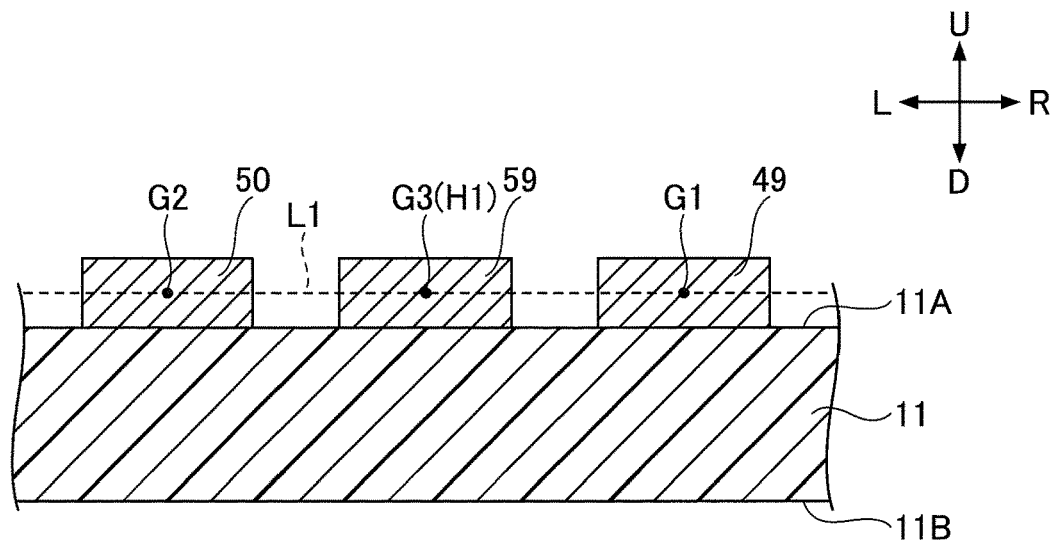
FIG. 10 is a cross-sectional view illustrating an arrangement of pads according to a second variation of the embodiment.

In the above embodiment, the ninth pad 59, which causes crosstalk, is provided on a surface that is different from the surface on which the ninth pad 49 and the tenth pad 50 are provided. However, the ninth pad 59 may be provided on the same surface as the ninth pad 49 and the tenth pad 50. FIG. 10 is a cross-sectional view illustrating an arrangement of the ninth pad 49, the tenth pad 50, and the ninth pad 59 according to a second variation of the embodiment. For example, as illustrated in FIG. 10, the ninth pad 59 may be provided on the first surface 11A between the ninth pad 49 and the tenth pad 50.

The configuration where the ninth pad 59 is provided on the first surface 11A can also cancel the crosstalk component and reduce noise resulting from crosstalk.

When the ninth pad 59 is provided on the first surface 11A between the ninth pad 49 and the tenth pad 50, the gravity center G3 may be located on the line L1. In such a case, strictly speaking, the foot of the perpendicular H1 does not exist. However, it is possible to use the location of the gravity center G3 as the location of the foot of the perpendicular H1 by assuming that a perpendicular with a zero length exists.

A connector-cable module according to an embodiment of the present invention is described above. However, the present invention is not limited to the specifically disclosed embodiment, and variations and modifications may be made without departing from the scope of the present invention. For example, the present invention may be applied not only to a connector-cable module conforming to a particular standard but also to various types of connector-cable modules.

What is claimed is:

1. A connector-cable module, comprising:
   a multicore cable; and
   a connector connected to one end of the multicore cable, wherein
   the multicore cable includes
      a first signal line that transmits a first signal,
      a second signal line that transmits a second signal, the first signal and the second signal forming a differential signal, and
      a third signal line that transmits a third signal that is independent of the first signal and the second signal;
   the connector includes
      a board,
      a first pad provided on the board and connected to the first signal line,
      a second pad provided on the board and connected to the second signal line, and
      a third pad provided on the board and connected to the third signal line;
   the connector is configured such that when a line passes through a first gravity center of the first pad and a second gravity center of the second pad, a foot of a perpendicular drawn from a third gravity center of the third pad to the line is located between the first gravity center and the second gravity center;
   the first pad and the third pad are at such a distance from each other that crosstalk occurs between the first signal and the third signal; and
   the second pad and the third pad are at such a distance from each other that crosstalk occurs between the second signal and the third signal.

2. The connector-cable module as claimed in claim 1, wherein the first signal line and the second signal line are stranded.

3. The connector-cable module as claimed in claim 1, wherein
   the first pad and the second pad are provided on a first surface of the board; and
   the third pad is provided on a second surface of the board, the second surface being opposite the first surface of the board.

4. A connector-cable module, comprising:
a multicore cable; and
a connector connected to one end of the multicore cable, wherein
the multicore cable includes
- a first signal line that transmits a first signal,
- a second signal line that transmits a second signal, the first signal line and the second signal line being stranded, and the first signal and the second signal forming a differential signal, and
- a third signal line that transmits a third signal that is independent of the first signal and the second signal;

the connector includes
- a board,
- a first pad provided on a first surface of the board and connected to the first signal line,
- a second pad provided on the first surface of the board and connected to the second signal line, and
- a third pad provided on a second surface of the board and connected to the third signal line, the second surface being opposite the first surface of the board; and the connector is configured such that when a line passes through a first gravity center of the first pad and a second gravity center of the second pad, a foot of a perpendicular drawn from a third gravity center of the third pad to the line is located between the first gravity center and the second gravity center.

* * * * *